United States Patent [19]

Farnworth

[11] Patent Number: 5,012,323
[45] Date of Patent: Apr. 30, 1991

[54] DOUBLE-DIE SEMICONDUCTOR PACKAGE HAVING A BACK-BONDED DIE AND A FACE-BONDED DIE INTERCONNECTED ON A SINGLE LEADFRAME

[75] Inventor: Warren M. Farnworth, Nampa, Id.
[73] Assignee: Micron Technology, Inc., Boise, Id.
[21] Appl. No.: 439,243
[22] Filed: Nov. 20, 1989
[51] Int. Cl.$^5$ .................. H01L 23/16; H01L 39/02; H01L 23/48; H01L 29/44
[52] U.S. Cl. .............................. 357/75; 357/70; 357/80; 361/420; 361/421; 174/52.4
[58] Field of Search .................... 357/70, 75, 80; 361/421, 420; 174/52.4

[56] References Cited

FOREIGN PATENT DOCUMENTS

0111151 8/1980 Japan ................................ 357/75
0130553 8/1983 Japan ................................ 357/75

*Primary Examiner*—Rolf Hille
*Assistant Examiner*—David Ostrowski
*Attorney, Agent, or Firm*—Angus C. Fox, III; Stanley N. Protigal

[57] ABSTRACT

A semiconductor package incorporating a pair of semiconductor dice on a single leadframe of the type having a wire-bonding region at each end of a die-attachment region which has both an upper and lower surface. The first of said pair of dice is back bonded to the upper surface of said die-attachment region; the second is face bonded to the lower surface of said die-attachment region. Electrical interconnections between said second die and said leadframe pass through an aperture in the leadframe. The dual-die package can be used to approximately double circuit density in a number of different packages, including a dual inline package (DIP), a small-outline J-lead package (SOJ), a single inline package (SIP), zig-zag inline package (ZIP), and other variations of the single- and double-row inline-lead packages.

1 Claim, 7 Drawing Sheets

DOUBLE-DIE SEMICONDUCTOR PACKAGE HAVING A BACK-BONDED DIE AND A FACE-BONDED DIE INTERCONNECTED ON A SINGLE LEADFRAME

FIELD OF THE INVENTION

This invention relates to semiconductor packaging techniques. More specifically, it relates to techniques for creating a semiconductor package having multiple integrated circuit dice mounted on a single leadframe.

BACKGROUND OF THE INVENTION

Semiconductor devices are typically constructed en masse on a silicon or gallium arsenide wafer through a process which comprises a number of deposition, masking, diffusion, etching and implanting steps. When the devices are sawed into individual units, each takes the form of an integrated circuit (IC) die. Each die is, essentially, a wafer-thin rectangular solid, having two pair of substantially planarly parallel edges, all edges being of substantially uniform width since the die was fabricated on a wafer of substantially uniform thickness throughout, and each pair of parallel edges being perpendicular to the other pair. Each die has a lower surface (also referred to herein as the back of the die) that is devoid of circuitry, and an upper surface (also referred to herein as the face of the die) with integrated circuitry constructed thereon, the circuitry being electrically accessible via die wire bonding pads which may be arranged in a variety of configurations on the face or edges of the die. In order to interface a die with other circuitry, it is (using contemporary conventional packaging technology) mounted on the die-mounting paddle of a leadframe strip which consists of a series of interconnected leadframes. The die-mounting paddle of a standard leadframe is larger than the die itself, and it is surrounded by the wire bonding pads of individual leads. The input/output wire bonding pads of the die are then connected one by one in a wire-bonding operation to the leadframe's wire bonding pads with extremely fine gold or aluminum wire. Following the application of a polyimide protective layer to the face of the die, it, and a portion of the leadframe to which it is attached, is encapsulated in a plastic material, as are all other die-leadframe assemblies on the leadframe strip. A trim and form operation then separates the resultant interconnected packages and bends the leads of each package into the proper configuration.

Figure 1:
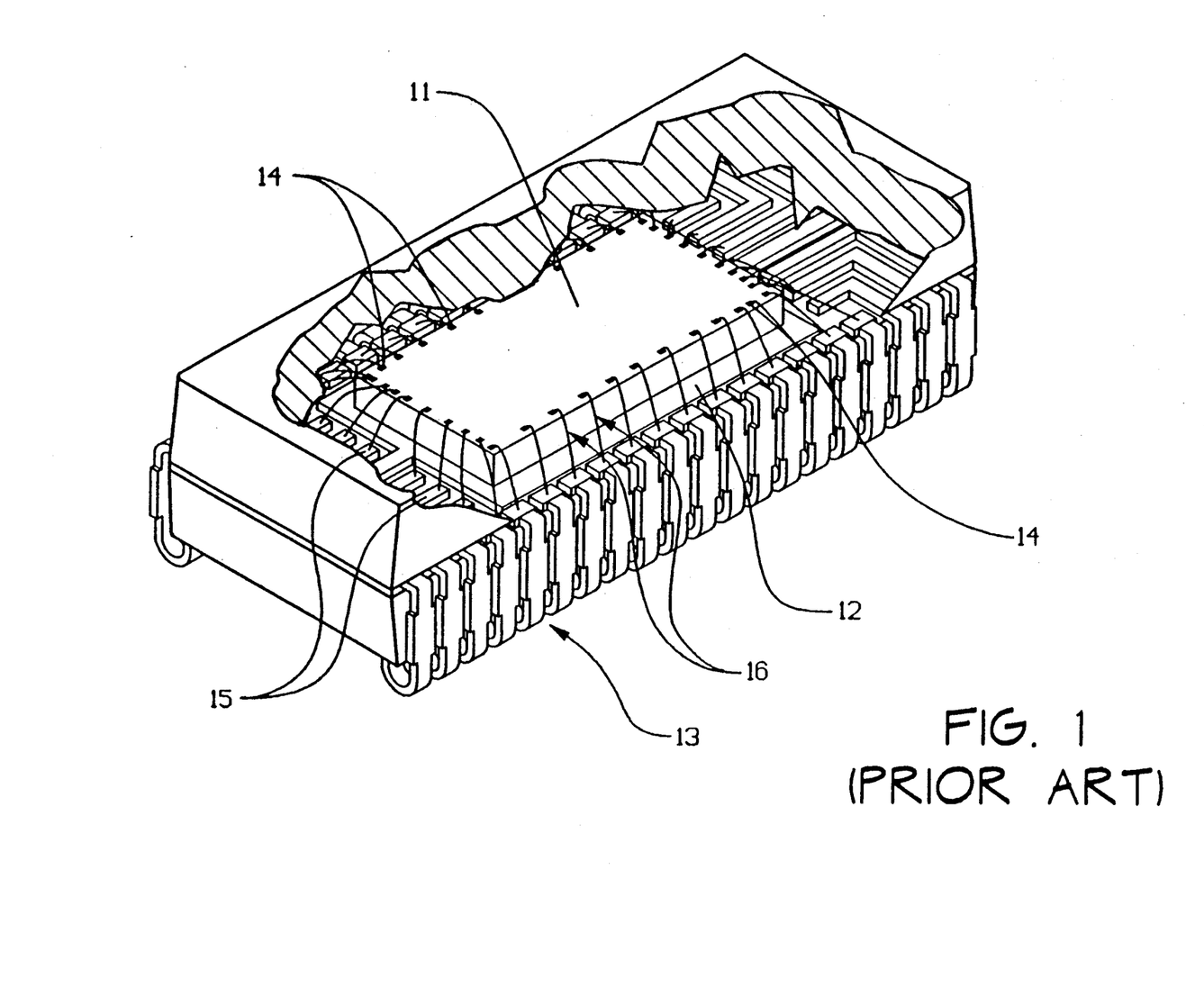
FIG. 1 is a cut-away isometric view of a plastic SOJ package having a conventional leadframe.

FIG. 1 is a cut-away isometric view of a typical conventional small-outline J-lead memory package, showing a die 11 bonded to the die-bonding paddle 12 of a standard-design leadframe 13, with each of the die's wire-bonding pads 14 connected to an associated leadframe wire-bonding pad 15 by means of fine metal wires 16.

In the interest of higher performance equipment and lower cost, increased miniaturization of components and greater packaging density have long been the goals of the computer industry. IC package density is primarily limited by the area available for die mounting.

A conventionally-designed leadframe resists attempts to increase circuit density. Since the die-bonding paddle must be larger than the die which is bonded to it, the larger the die, the less space that remains around the periphery of the die-bonding pad for wire bonding. In addition, the wire-bonding pads on the standard leadframe provide anchorage for the leads when they and the die are encapsulated in plastic. Therefore, as the die size is increased in relation to package size, there is a corresponding reduction in the space along the sides of the package for the encapsulating plastic which joins the top and bottom plastic body halves at the mold part line and anchors the leads. As the leads are subjected to the normal stresses of forming and assembly operations, the plastic may crack, with a consequent destruction of the package seal and a substantial increase in the probability of premature package failure. For these reasons, the standard leadframe design is not particularly adaptable to increases in packaging density.

In order to eliminate the aforementioned constraints of the standard leadframe, an improved leadframe has been developed at Micron Technology, Inc. The leadframe, which has a wire-bonding region at each end of the die attachment region, supports two types of die-mounting and wire bonding systems. The first system is relatively conventional, with the circuitry of the die face-up, the die adhesively and insulatedly attached by its substrate (back-bonded) to extensions of the individual leadframe leads, and the bonding wires running from bonding pads on the die, over the edge of the die, to the ends of the lead extensions below. The second system was developed by William C. Ward at IBM for his "A-wire" design leadframe, and requires that the die be adhesively and insulatedly attached by its face (face-bonded) to the leadframe, with the bonding wires running from the wire bonding pads of the die, through an aperture in the leadframe, to the ends of the lead extensions above. Micron Technology's improved leadframe is described in a patent application (now abandoned) entitled "Leadframe Having a Wire-Bonding Region at Each End of the Die Attachment Region", accorded serial number 07/381,144 and a filing date of July 17, 1989. This improved leadframe is described below, in reference to FIGS. 2 and 3.

Figure 2:
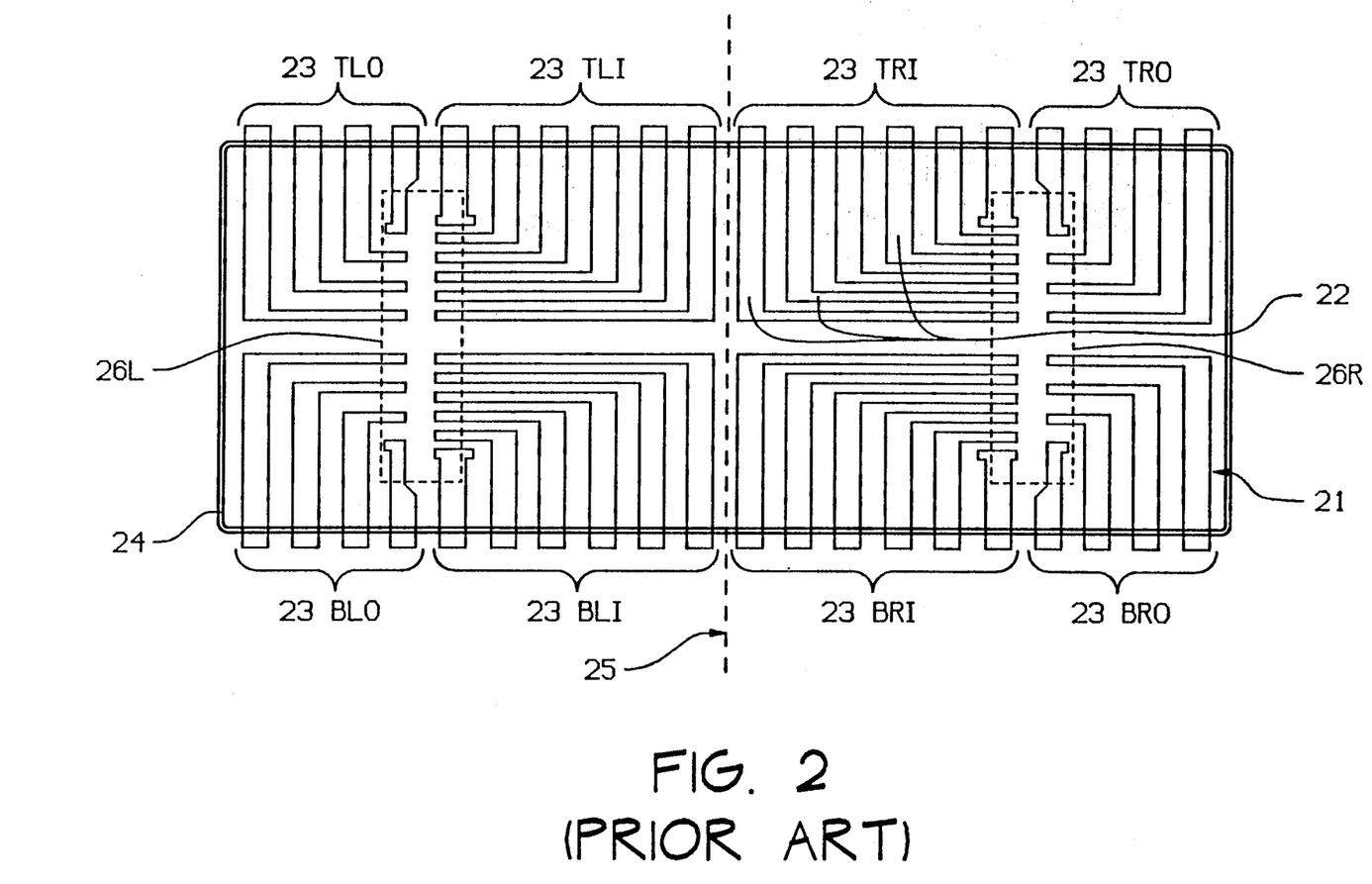
FIG. 2 is a top plan view of a dual-row, inline-lead embodiment of the improved leadframe.

Referring now to FIG. 2, a dual-row, inline-lead embodiment of the improved leadframe 21 has no discrete die bonding pad. A rectangular die is attached to lead extensions 22, which all line in a common plane, via an electrically-insulative, mechanically-protective film layer (not shown in this figure), both sides of which are adhesively coated. Although polyimide film is presently used, other substitute films may be identified. By definition, a lead extension 22 is continuous with its associated lead 23. The lead extension ultimately will be encapsulated within the plastic of the package body, while the lead, itself, will remain exposed. The outline of the package body 24 shows the relative position of leadframe 21 with respect to the encapsulating plastic of the package. Since this is a dual-row leadframe, there are both top row leads 23T and bottom row leads 23B. For this particular embodiment, each row of leads (23T and 23B) is divided into right and left groups (designated by the letters "R" and "L", respectively) of substantially equal number by the leadframe's axis of lateral symmetry 25. Each of the resulting four groups is further divided into two subgroups on the basis of its location with respect to left and right wire-bonding zones, which are demarcated by broken lines 26L and 26R, respectively. Those leads located between wire-bonding zones 26L and 26R pertain to an "inner" lead subgroup (designated by the letter "I"). The remainder of the leads pertain to an "outer" lead subgroup (designated by the letter "O"). For example, the six leads 23TRI pertain to the top, right, inner lead subgroup, whereas the four leads 23BLO pertain to the bottom, left, outer lead subgroup. Each lead 23*** (the asterisks indicate a reference to all leads in general) has an extension 22 which is shaped such that it is directed to a lead wire-bonding zone. All leads pertaining to the right subgroup 23*R* (here the asterisks indicate a reference to all leads within the right subgroup) have extensions 22 which terminate in wire-bonding zone 26R, located to the right of the leadframe's lateral line of symmetry 25; all leads pertaining to the left subgroup 23*L* have extensions which terminate in wire-bonding zone 26L, located to the left of the leadframe's lateral line of symmetry 25. Each wire-bonding zone consists of a group of lead extensions which are located on the perimeter of a substantially rectangular or trapezoidal aperture within said leadframe. The extensions of leads 23*LO are angled so that the ends thereof are located to the left of the aperture of left wire-bonding zone 26L, whereas the extensions of leads 23*LI are angled so that they are located to the right of left wire-bonding zone 26L. An aperture is thus formed between the ends of the extensions of leads 23*LO and those of leads 23*LI. The extensions of leads 23*R* are arranged in a configuration that is a mirror of those on the left side of the leadframe. Although the lead extensions 22 are generally L-shaped, they could also be curved or irregularly shaped. It is important only that the lead extensions 22 neither touch nor overlap one another. Hereinafter, this embodiment of the improved leadframe shall be referred to as the dual-row, inline-lead improved leadframe.

Figure 3:
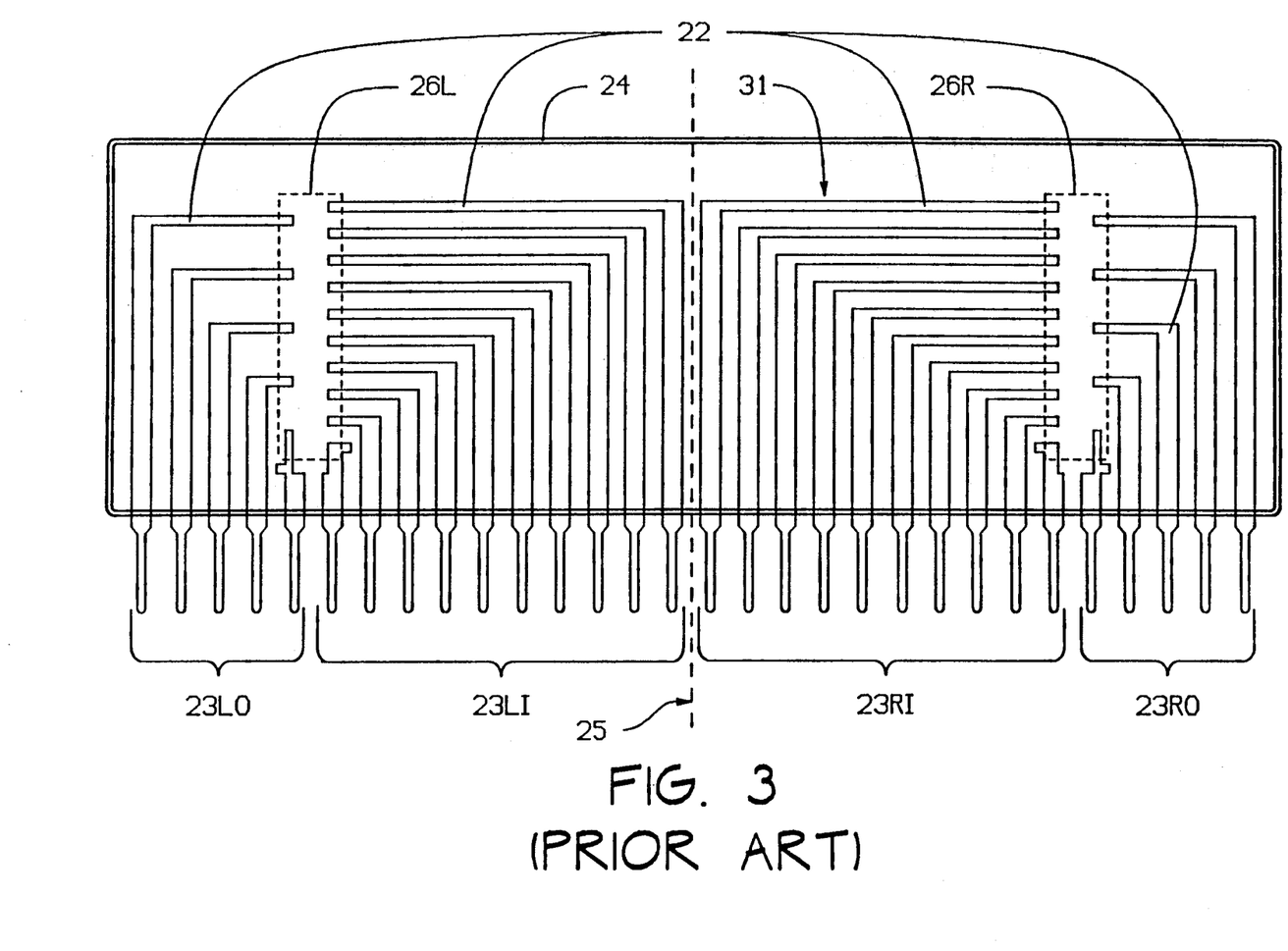
FIG. 3 is a top plan view of a single-row, inline-lead embodiment of the improved leadframe.

Referring now to FIG. 3, a single-row, inline-lead embodiment of the improved leadframe 31 is similar to the embodiment depicted in FIG. 2, except that the top row of leads has been eliminated. Therefore, the top and bottom lead designators "T" and "B", respectively, are not employed in reference to the leads 34 of leadframe 31. Parts of the leadframe of FIG. 3 that are equivalent to those of the leadframe of FIG. 2 are similarly numbered. Leadframe 31 has an axis of lateral symmetry 25, and left and right wire-bonding regions 26L and 26R, respectively. The design of leadframe 31 may be used in a single inline package (SIP), in a zig-zag inline package (ZIP), or in other single-row, inline package configurations. Hereinafter, this embodiment of the improved leadframe shall be referred to as the single-row, inline-lead embodiment of the improved Micron leadframe.

SUMMARY OF THE INVENTION

The present invention utilizes the improved leadframe described in the previous section to approximately double package circuit density. The dual-die and leadframe combination can be used in a number of different packages, including a dual inline package (DIP), a small-outline J-lead package (SOJ), a single inline package (SIP), a zig-zag inline package (ZIP), and other variations of the single-and double-row inline-lead packages. Essentially, the technique combines a back-bonded die and a face-bonded die on a single leadframe.

The mounting of a pair of dice on a single leadframe is useful for a number of reasons. Firstly, it permits package density to be approximately doubled, without requiring that the integrated circuitry on the dice be commensurately shrunk. For example, a manufacturer of dynamic random access memories may wish to be among the first suppliers of the next density generation, yet his process technology may not be sufficiently mature to shrink a single die sufficiently for use in a single-die package. Therefore, he might split the die into two segments. The first and larger segment would be face-bonded to the improved leadframe, and might contain half the array circuitry plus the peripheral circuitry; the second segment would be back-bonded to the improved leadframe, and might contain only the remaining half of the array circuitry. Secondly, it allows a pair of complementary chips (e.g., a microprocessor chip and a clock chip) to be mounted in close proximity. Such an architecture results, not only in greater circuit density and speed, but also eliminates the noise and capacitive problems that are often associated with the interconnection of discrete components via circuit-board trace lines. Third, the split die architecture may offer more flexibility in connecting the dice for custom applications.

PREFERRED EMBODIMENT OF THE INVENTION

Figure 4:
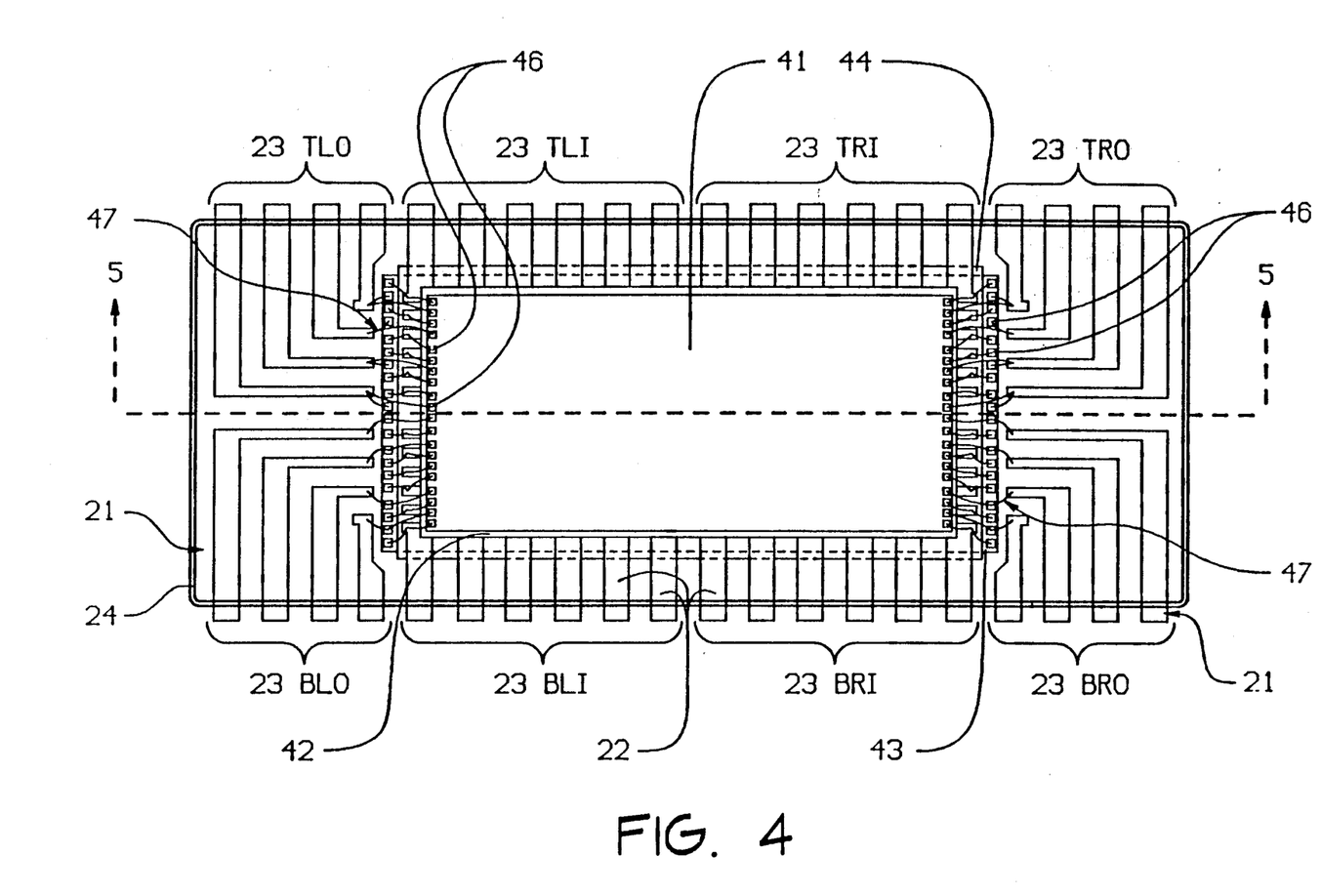
FIG. 4 is a top plan view of a pair of IC dice mounted on the leadframe of FIG. 2.

Referring now to FIG. 4, a pair of integrated circuit, dice are mounted on opposite sides of the single dual-row, inline-lead improved leadframe of FIG. 2. Each die is as thick as the semiconductor wafer from which it has been diced or sawed. Each die is conventional (i.e., it conforms to the description of an integrated circuit die given earlier in this disclosure), with the exception that the wire bonding pads on each die are arranged in a pair of columns, each column being located on the die's upper surface, adjacent one of a single pair of the planarly parallel edges. The upper die 41 is back-bonded to the upper surface of the lead extensions 22 within the upper leadframe die-bonding region via a first adhesively-coated insulative film layer 42. The lower die 43 is face-bonded to the lower surface of the lead extensions 22 within the lower leadframe die-bonding region via a second adhesively-coated insulative film layer 44. It will be noted that the upper die attach region spans the distance between the leadframe's pair of wire bonding zones (refer to items 26L and 26R of FIGS 2 and 3), while the lower die attach region extending into, but not beyond, each wire bonding zone. It will also be noted that each column of wire bonding pads on lower die 43 positioned within a single wire bonding zone aperture, while each column of wire bonding pads on upper die 41 is located adjacent to a single wire bonding zone aperture. Each aperture is, of course, associated with only one column of wire bonding pads of each die. The wire-bonding pads 46 on both upper die 41 and lower die 43 are interconnected with the ends of their associated lead extensions 22 with gold or aluminum bonding wires 47.

It will be noted that each bonding wire interconnects one lead extension end with at least one die wire bonding pad which pertains to a column of bonding pads that is either within the aperture (for lower die 43) or adjacent to the aperture (for upper die 41) to which that particular extension pertains. It will be further noted that bonding wires 47 which interconnect die wire bonding pads 46 on the lower die 43 pass through that aperture. Following certain additional conventional steps, such as the application of a polyimide protective layer to the face of upper die 41, the pair of dice, lead extensions and bonding wires are encapsulated in a plastic body.

Figure 5:
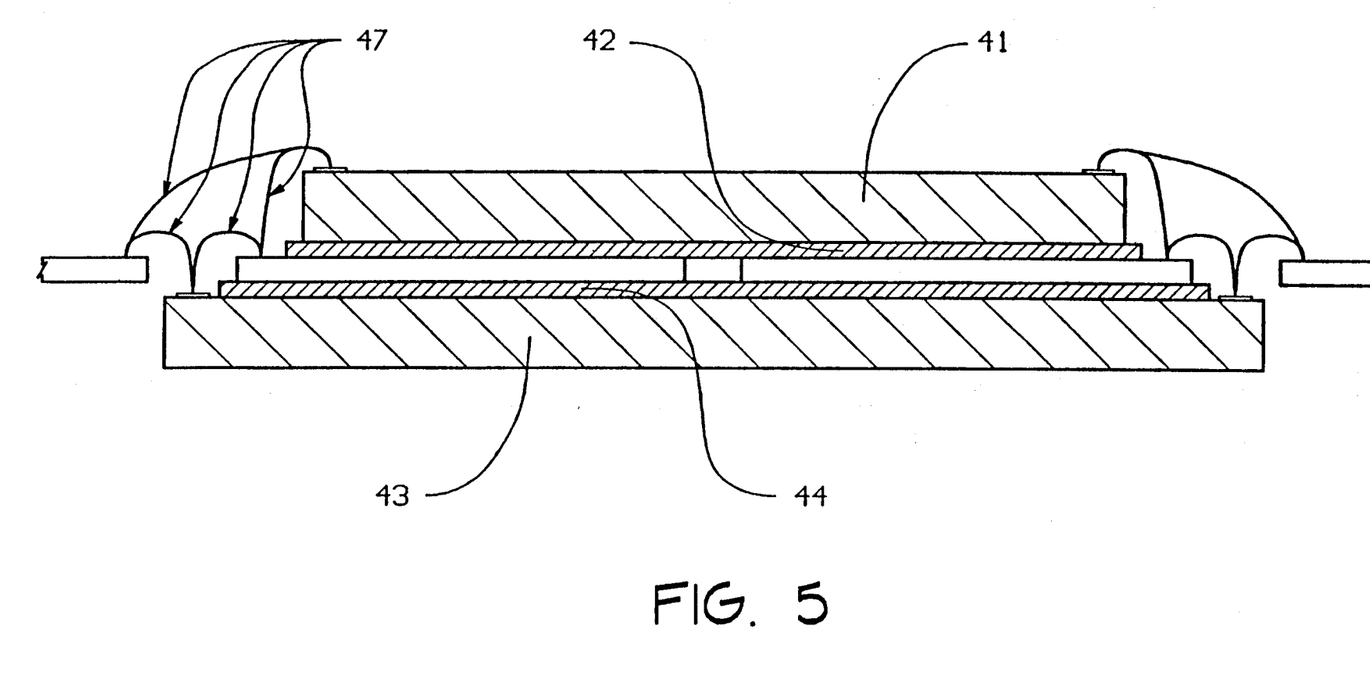
FIG. 5 is a cross-sectional view of the leadframe and IC die assembly of FIG. 4 through broken line 5—5.

Referring now to FIG. 5, which is a cross-sectional view of FIG. 4 through broken line 5—5, the dual-die attachment scheme is readily apparent. The numbers of this figure correspond to those of FIG. 4. First insulative film layer 42 and second insulative film layer 44 are more clearly visible in this view, as is the interconnection scheme of wires 47.

Figure 6:
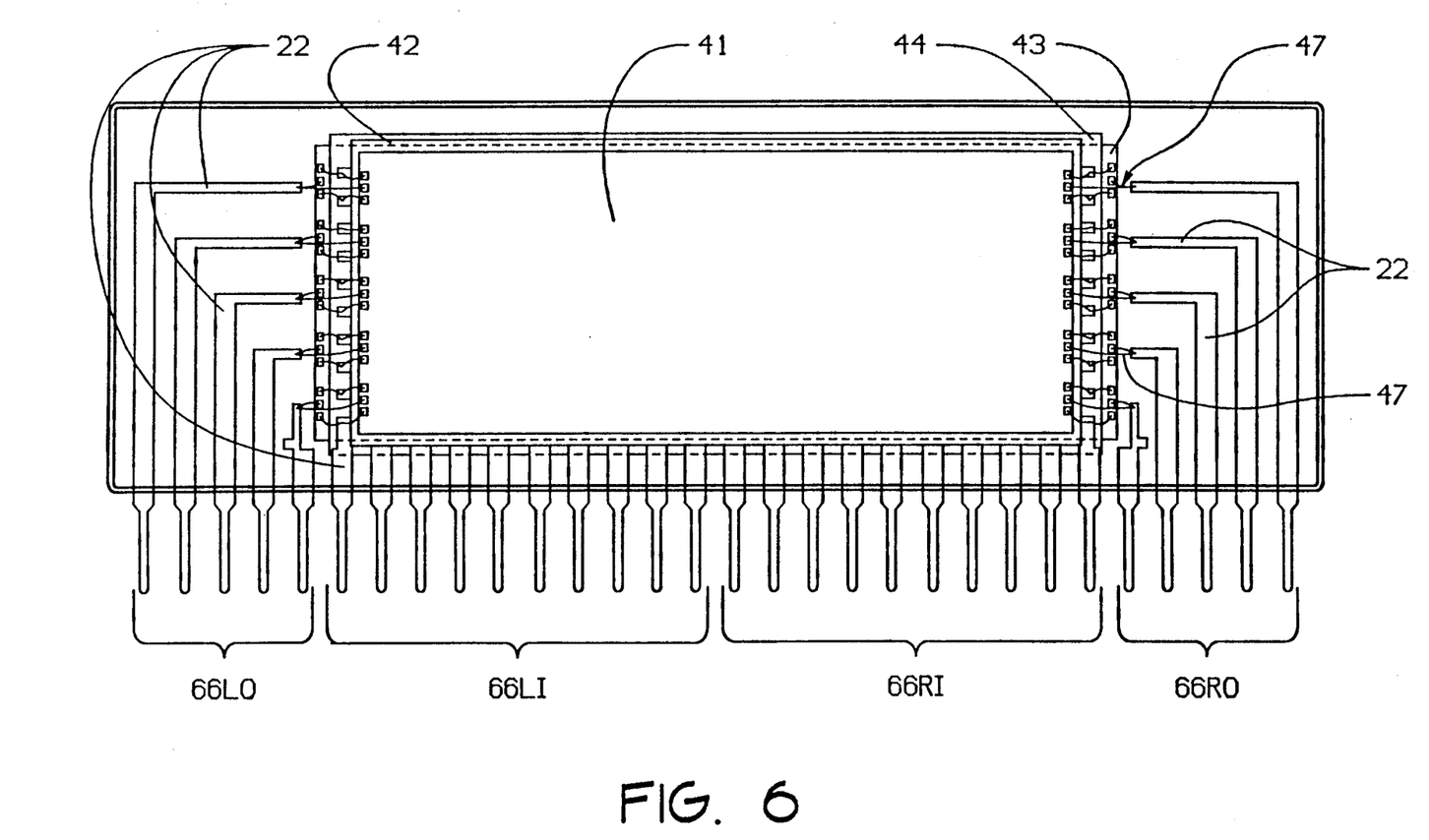
FIG. 6 is a top plan view of a pair of IC dice mounted on the leadframe of FIG. 3.

FIG. 6 depicts a pair of integrated circuit dice are mounted on opposite sides of the single-row, inline-lead improved Micron leadframe of FIG. 3. The die attachment and wire-bonding schemes are identical to those used for the dual-row, inline-lead leadframe of FIG. 4. Upper die 41 is back-bonded to the upper surface of the lead extensions 22 within the upper leadframe die-bonding region via a first adhesively-coated insulative film layer 4. Lower die 43 is face-bonded to the lower surface of the lead extensions 22 within the lower leadframe die-bonding region via a second adhesively-coated insulative film layer 44. The wire-bonding pads 46 of both upper die 41 and lower die 43 are interconnected with the ends of their associated lead extensions 22 with gold or aluminum wires 47.

Figure 7:
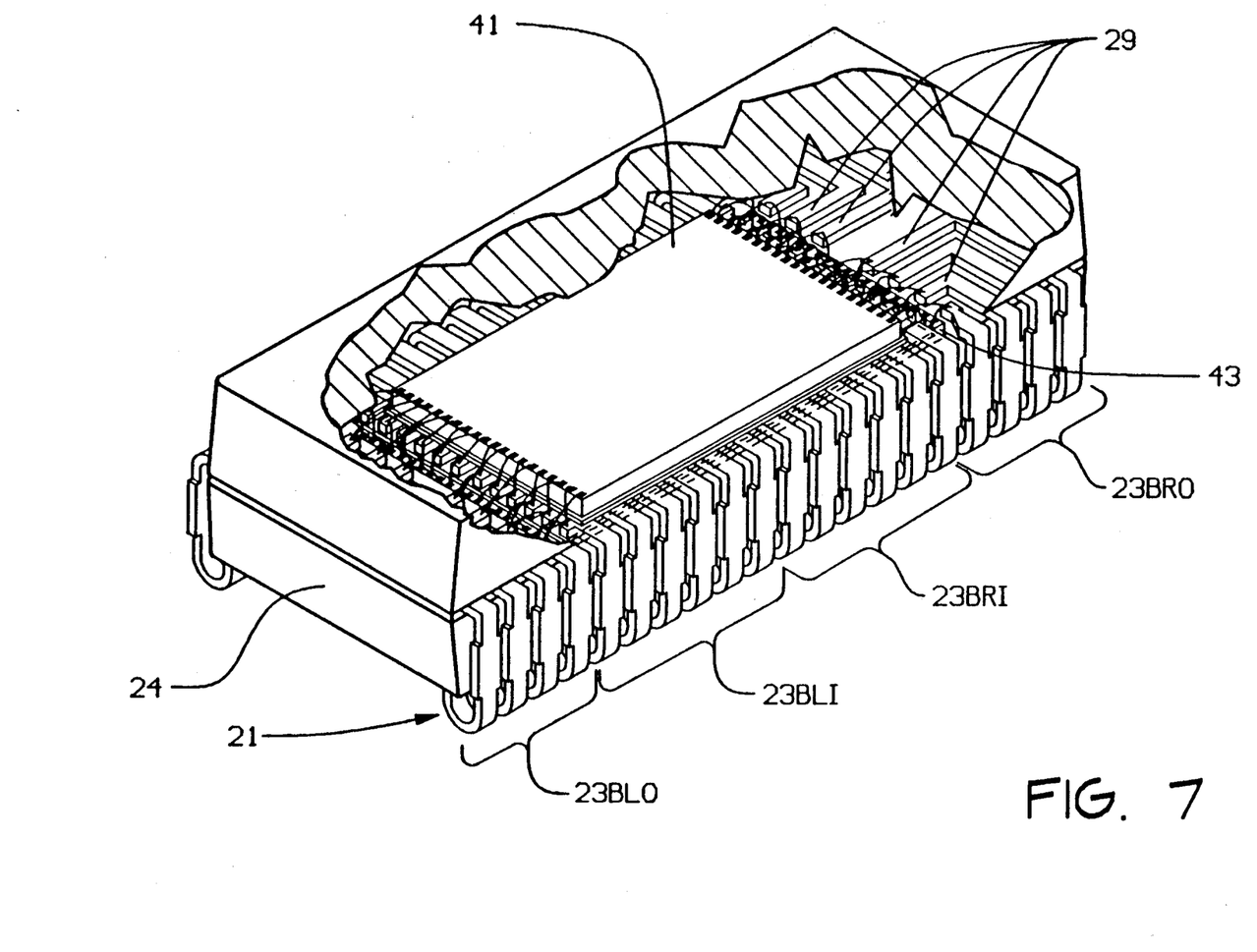
FIG. 7 is a partially cut-away isometric view of a plastic dual-row inline-SOJ-lead package having a pair of IC dice mounted on the improved leadframe.

FIG. 7 isometrically depicts a partially cut-away view of a dual-die SOJ package incorporating the improved leadframe of FIG. 2. Items which correspond to those of earlier Figures are numbered identically.

Although only certain embodiments of the invention have been described herein, it will be apparent to one skilled in the art that changes and modifications may be made thereto without departing from the spirit and the scope of the invention as claimed.

I claim:

1. A semiconductor package comprising:
   a first rectangular, wafer-like semiconductor die, and
      a second rectangular, wafer-like semiconductor die that is rectangularly smaller than said first die in at least one dimension, each die having two pair of substantially planarly parallel edges, each pair of parallel edges being perpendicular to the other pair, a lower surface consisting of a substrate, and an upper surface with integrated circuitry constructed thereon, said circuitry being electrically accessible via die wire bonding pads which, on each die, are arranged in a pair of columns, each of which is located on the die's upper surface, adjacent one of a single pair of planarly parallel edges;
   a leadframe having a plurality of leads, each lead having an extension that is continuous therewith, each extension lying in a plane common to all other extensions and having both an upper and lower surface, the lower surfaces of at least some of said extensions providing a lower die attach region for said first die, and the upper surfaces of at least some of said extensions providing an upper die attach region for said second die, said extensions being routed such that they neither touch nor overlap one another, and so that they terminate in only one of a pair of wire bonding zones, each of said wire bonding zones consisting of a plurality of lead extension ends located on the perimeter of a aperture with said leadframe, said upper die attach region spanning the distance between said pair of wire bonding zones, said lower die attach region extending into, but not beyond, each wire bonding zone, the upper surface of said first die being insulatedly and adhesively attached to said lower die-attach region such that each column of wire bonding pads on said first die is located within a single aperture, the lower surface of said second die being insulatedly and adhesively attached to said upper die-attach region such that each column of wire bonding pads on said second die is located adjacent to a single aperture, each aperture being associated with only one column of wire bonding pads of each die;
   a plurality of bonding wires, each of which interconnects one lead extension end with at least one die wire bonding pad which pertains to a column of bonding pads that is either within the aperture (for said first die) or adjacent to the aperture (for said second die) to which that extension pertains, bonding wires which interconnect die wire bonding pads on said first die passing through that aperture; and
   a plastic body which encapsulates said first and second dice, said lead extensions and said bonding wires, but not said leads.

* * * * *